United States Patent
Kochersperger

(10) Patent No.: US 7,542,263 B2
(45) Date of Patent: Jun. 2, 2009

(54) OVERLAY CORRECTION BY REDUCING WAFER SLIPPING AFTER ALIGNMENT

(75) Inventor: Peter Kochersperger, Easton, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/695,949

(22) Filed: Apr. 3, 2007

(65) Prior Publication Data

US 2007/0165357 A1 Jul. 19, 2007

Related U.S. Application Data

(62) Division of application No. 10/780,877, filed on Feb. 19, 2004.

(51) Int. Cl.
*H01L 21/683* (2006.01)
*C23F 1/00* (2006.01)

(52) U.S. Cl. .................. 361/234; 361/230; 156/345.51; 156/345.52

(58) Field of Classification Search .................. 361/234, 361/230; 156/345.51, 345.52
See application file for complete search history.

(56) References Cited

U.S. PATENT DOCUMENTS

| 4,744,550 A | 5/1988 | Oglesbee |
| 4,775,797 A | 10/1988 | Stengl et al. |
| 6,141,203 A * | 10/2000 | Sherman ..................... 361/234 |
| 6,375,176 B1 | 4/2002 | Getchel et al. |
| 6,392,240 B1 | 5/2002 | Aizaki |
| 6,416,618 B2 * | 7/2002 | Tsuchihashi et al. ... 156/345.51 |
| 6,551,404 B2 * | 4/2003 | Snijders et al. ............. 118/725 |
| 6,653,639 B1 | 11/2003 | Novak |
| 6,734,117 B2 | 5/2004 | Sogard |
| 2005/0186517 A1 | 8/2005 | Kochersperger |
| 2006/0005911 A1 | 1/2006 | Kubo et al. |

FOREIGN PATENT DOCUMENTS

JP 55-32022 A 3/1980

(Continued)

OTHER PUBLICATIONS

Office Action and Translation of Office Action for Patent Application No. 2005-044043 mailed Apr. 8, 2008, 4 pgs.

(Continued)

*Primary Examiner*—Stephen W Jackson
*Assistant Examiner*—Zeev Kitov
(74) *Attorney, Agent, or Firm*—Sterne, Kessler, Goldstein & Fox, P.L.L.C.

(57) ABSTRACT

A method and apparatus for correcting overlay errors in a lithography system. During lithographic exposure, features being exposed on the wafer need to overlay existing features on the wafer. Overlay is a critical performance parameter of lithography tools. The wafer is locally heated during exposure. Thermal expansion causes stress between the wafer and the wafer table, which will cause the wafer to slip if it exceeds the local frictional force. To increase the amount of expansion allowed before slipping occurs, the wafer chuck is uniformly expanded after the wafer has been loaded. This creates an initial stress between the wafer and the wafer table. As the wafer expands due to heating during exposure, the expansion first acts to relieve the initial stress before causing an opposite stress from thermal expansion. The wafer may be also be heated prior to attachment to the wafer chuck, creating the initial stress as the wafer cools.

11 Claims, 6 Drawing Sheets

FOREIGN PATENT DOCUMENTS

| | | |
|---|---|---|
| JP | 62-118351 A | 5/1987 |
| JP | 62-256451 A | 11/1987 |
| JP | 10-92728 A | 4/1998 |
| JP | 410125630 A | 5/1998 |
| JP | 11-16807 A | 1/1999 |
| JP | 11-251227 A | 9/1999 |
| JP | 2001079754 A | 3/2001 |
| JP | 2002-198307 A | 7/2002 |
| JP | 2003-224054 A | 8/2003 |
| JP | 2004-6706 A | 1/2004 |
| WO | WO 99/34412 A2 | 7/1999 |
| WO | WO 00/04570 A2 | 1/2000 |

OTHER PUBLICATIONS

English Abstract for Japanese Publication No. JP2003-508893T published Mar. 4, 2003, 1 pg (retrieved from ep.espacenet.com on Jun. 5, 2008).

English Abstract for Japanese Publication No. JP2002-500438T published Jan. 8, 2002, 1 pg (retrieved from ep.espacenet.com on Jun. 5, 2008).

* cited by examiner

OVERLAY CORRECTION BY REDUCING WAFER SLIPPING AFTER ALIGNMENT

CROSS-REFERENCE TO RELATED APPLICATIONS

The present application is a divisional of U.S. patent application Ser. No. 10/780,877, filed Feb. 19, 2004, which is incorporated by reference herein in its entirety.

BACKGROUND OF THE INVENTION

1. Field of the Invention

The present invention is directed generally to photolithography. More particularly, the present invention relates to wafer alignment in a photolithographic system.

2. Related Art

Photolithography (also called microlithography) is a semiconductor device fabrication technology. Photolithography uses radiation, such as ultraviolet or visible light, to generate fine patterns in a semiconductor device design. Many types of semiconductor devices, such as diodes, transistors, and integrated circuits, can be fabricated using photolithographic techniques. Exposure systems or tools are used to implement photolithographic techniques, such as etching, in semiconductor fabrication. An exposure system typically includes an illumination system, a reticle (also called a mask) or spatial light modulator (SLM) for creating a circuit pattern, a projection system, and a wafer alignment stage for aligning a photosensitive resist-covered semiconductor wafer. The illumination system illuminates a region of the reticle or SLM with a preferably rectangular slot illumination field. The projection system projects an image of the illuminated region of the reticle circuit pattern onto the wafer.

As semiconductor device manufacturing technology advances, there are ever increasing demands on each component of the photolithography system used to manufacture the semiconductor device. This includes increasing demands on the accuracy of the wafer alignment. A wafer is typically mounted on a wafer chuck, also referred to as a wafer table. During exposure, the features being exposed on the wafer need to overlay existing features on the wafer. To achieve overlay performance, the wafer is aligned to the wafer stage prior to exposure. Any movement of the wafer relative to the wafer stage after alignment results in overlay errors.

During exposure, the wafer is heated locally due to the energy transferred to the wafer from the exposure beam. This heating causes the wafer to expand. If the wafer expansion is unchecked, the expansion exceeds overlay error requirements. Clamping the wafer to the wafer chuck reduces the amount the wafer expands. The wafer chuck is typically designed to have a larger thermal mass than the wafer and is manufactured of a material which has very low thermal expansion. This results in relatively little expansion of the wafer chuck relative to the wafer. The wafer chuck is also typically designed to be much stiffer than the wafer, such that if the wafer is sufficiently clamped to the wafer chuck, the thermal expansion of the wafer is reduced.

If the clamping force between the wafer and the wafer chuck is not sufficient to prevent wafer expansion, the wafer can slip on the wafer chuck and larger wafer expansion will occur, resulting in larger overlay errors.

Slipping due to wafer expansion can be reduced by tightly clamping the wafer to the surface of the wafer chuck with a vacuum. This creates a frictional force between the wafer and the wafer chuck. However, if the wafer expansion force exceeds the frictional force, the wafer will slip, causing an overlay error. In extreme ultraviolet ("EUV") systems, the chances of slipping increase because the environment surrounding the wafer during exposure is also a vacuum. Electrostatic clamping, which is much weaker than vacuum clamping, must thus be used in lieu of a vacuum clamp.

Therefore, what is needed is a system and method for reducing the effects of wafer expansion during exposure.

SUMMARY OF THE INVENTION

The present invention reduces wafer slipping by uniformly expanding the wafer chuck after the wafer has been attached. This creates an initial stress on the interface between the wafer and the wafer chuck, rather than a zero stress interface. Because the wafer chuck expands in relation to the wafer, the initial stress is opposite that caused by wafer expansion during exposure. As the wafer heats up from exposure, the initial stress will first be reduced to a zero-stress interface. Only after this point will the expansion of the wafer create an expansion stress on the interface between the wafer and wafer chuck. Ideally, the amount of heating without wafer slipping could be doubled with the present invention.

The wafer table expansion can be achieved in several ways. In one embodiment, a sealed circular tube, or annular ring, is attached to the circumference of the wafer chuck. The annular ring is then pressurized. The annular ring expands when pressurized, thereby expanding the wafer chuck to which it is attached. In a similar embodiment, the annular ring is not attached to the edge of the wafer chuck, but is embedded inside the wafer chuck through a groove or cavity.

In another embodiment, a plurality of force actuators is attached to the edge of the wafer chuck. These force actuators act on the wafer chuck to expand it.

The expansion of the wafer chuck can also be thermally induced. In one embodiment, a heater is directly attached to the wafer chuck. In another embodiment, a proximity heater is placed near the wafer chuck. In still another embodiment, the wafer chuck is made out of an electrically conductive material, and is connected to a power source. In a further embodiment, the wafer is heated before attachment, so that it is warmer relative to the wafer chuck. In this embodiment, when the wafer is attached to the wafer chuck, they reach a thermal equilibrium. As the wafer cools, it contracts and thus creates an initial stress opposite that of an expansion stress. The expansion from each of these embodiments results in nearly uniform expansion of the wafer, similar to an overall magnification of the wafer, and thus can be compensated for in lithographic exposure tools.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

Figure 1:
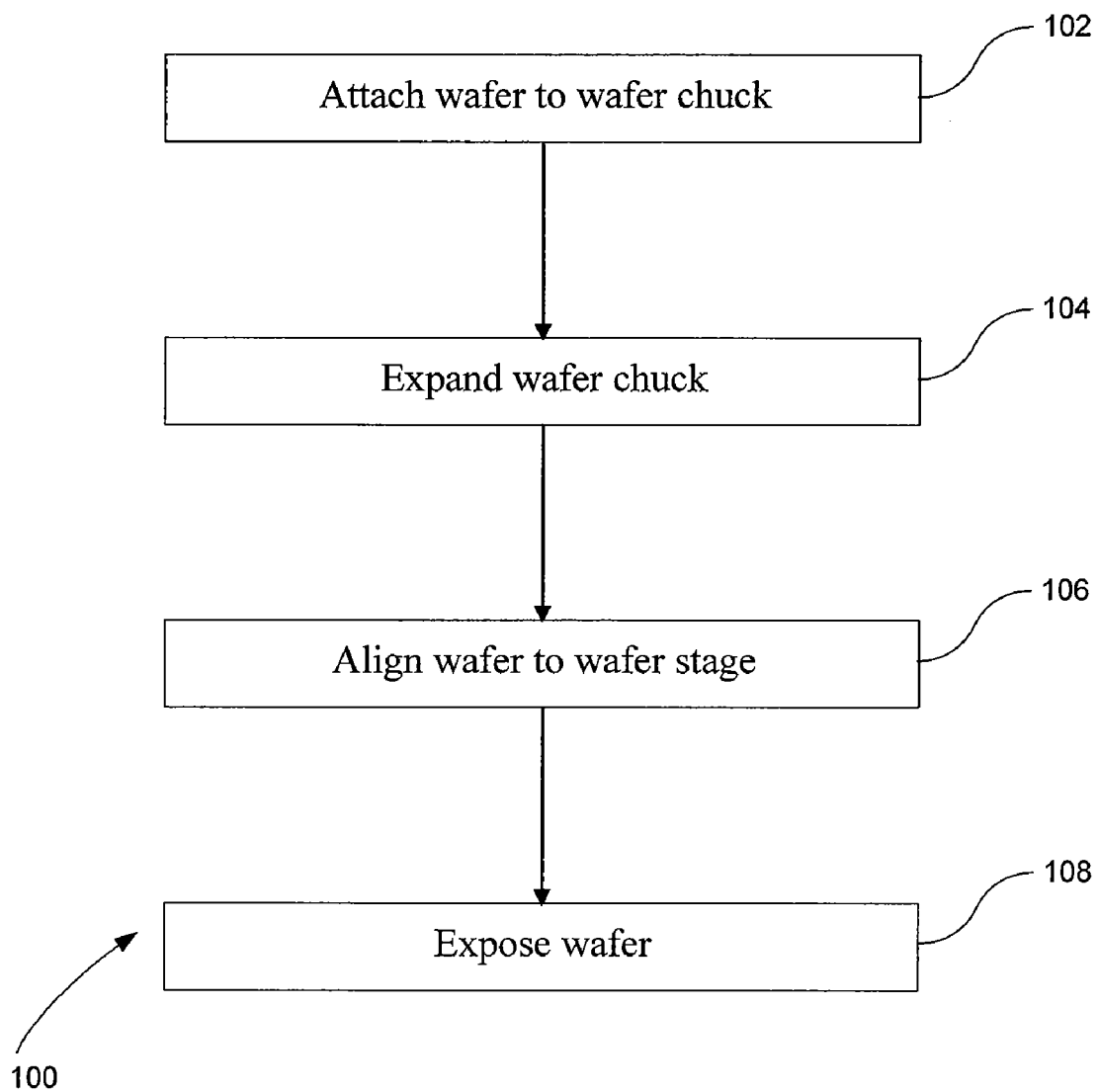
FIG. 1 is a flowchart of a method according to an embodiment of the present invention.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

In current lithography systems, wafer slipping is reduced by tightly clamping the wafer to the surface of a wafer chuck. One method of clamping the wafer is by creating a vacuum between the wafer and the wafer chuck.

This works because there is a pressure differential between the vacuum and the surrounding environment. In extreme ultra-violet ("EUV") lithography, however, the environment surrounding the wafer during exposure is also a vacuum. This prevents using a vacuum as a clamping force.

Alternatively, electrostatic clamping is used to clamp the wafer to the wafer chuck. A disadvantage of typical electrostatic clamping is that the amount of force achieved with electrostatic clamping is inherently limited.

Electrostatic clamping is also related to the time taken to clamp and release the wafer. As a result, electrostatic clamping tends to provide between $1/10$ and $1/15$ the clamping force of vacuum clamping. This means that the frictional force between the wafer and the wafer chuck also decreases to $1/10$ to $1/15$ the frictional force in a vacuum system.

In most systems, the interface between the wafer and the wafer chuck is approximately a zero stress interface at the time of clamping. This means that there is no force on the interface to counteract the frictional force between the wafer and the wafer chuck. When the wafer is exposed, energy in the exposure beam heats the wafer and causes the wafer to expand. When some parts of the wafer are being exposed while others are not, the expansion causes the wafer to slip if it is not sufficiently clamped. Slipping occurs because the thermally-induced expansion stress exceeds the frictional force holding the wafer in place. This introduces error into the system. In a system where electrostatic clamping is used, the frictional force is low, and the expansion stress does not need to be very large to overcome the frictional force.

For EUV systems, wafer heating is likely to be higher than in non-EUV systems. This is a result of a significant amount of non-exposure energy included in the EUV exposure beam being transferred to the wafer. Most of this energy is in the form of infrared ("IR") radiation. In some exposures, IR energy at the wafer may equal that of the energy needed to expose the wafer (also referred to as the "dose energy"). This effectively doubles the heating at the wafer compared to non-EUV systems.

These factors result in a situation where there is $1/10$ to $1/15$ the resistance to slipping as compared to a vacuum system, and twice the heating. Wafer slipping thus becomes much more likely, causing the dose limit determined by overlay to be small in comparison with the dose allowed for non-EUV systems.

FIG. 1 is a flowchart of a method 100 according to an embodiment of the present invention. Method 100 allows application of a larger dose energy before wafer slipping becomes a threat. Although the present invention will be described herein with reference to EUV systems using electrostatic clamping, one skilled in the art will recognize that the present invention may also be used in non-EUV systems and/or lithography systems using clamping methods other than electrostatic clamping.

In step 102, a wafer is attached to a wafer chuck in a lithography system. In one embodiment, the wafer is attached using electrostatic clamping. In another embodiment, the wafer is attached using vacuum clamping.

In step 104, the wafer chuck is uniformly expanded. This creates an initial stress on the interface between the wafer and the wafer chuck. During exposure, due to heat transfer, the size of a wafer increases with respect to the wafer chuck. By expanding the wafer chuck prior to exposure, the size of the wafer is effectively decreased with respect to the chuck. Therefore, the initial stress caused by wafer chuck expansion is opposite the stress caused by wafer expansion. The initial stress may be almost equal to the frictional force between the wafer and the wafer chuck. In this embodiment, additional stress would overcome the frictional force, and cause the wafer to slip prior to exposure. However, by keeping the initial stress just below the magnitude of the frictional force, slippage is prevented.

In step 106, the wafer is aligned to the wafer stage of a lithography system. This alignment centers the wafer in an exposure beam path, and ensures proper focus and alignment of a lithography pattern during exposure.

In step 108, the wafer is exposed, causing the wafer to expand. Because the expansion stress is opposite that of the initial stress, expanding the wafer first acts to relieve the initial stress. Only after relieving the initial stress is a new expansion stress created as a result of the wafer getting larger with respect to the wafer chuck.

If the initial stress is almost equal to the frictional force between the wafer and the wafer chuck, the exposure dose may be almost doubled compared to a system having no initial stress.

Figure 2A:
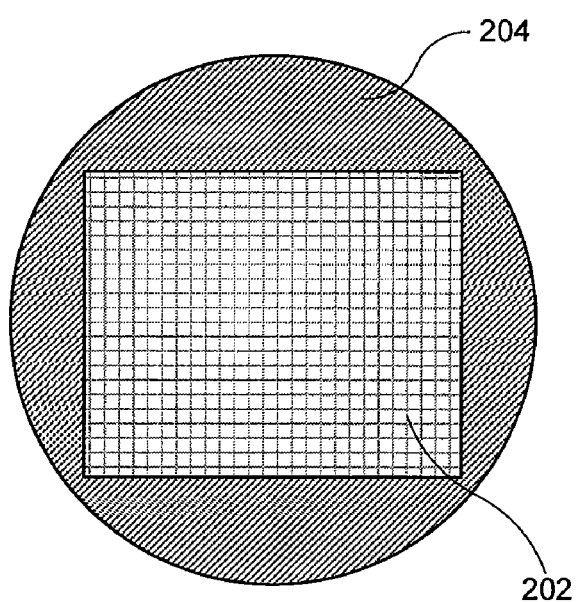
FIG. 2A is an illustration of a wafer attached to a wafer chuck.

FIGS. 2A to 2D illustrate the succession of method 100. FIG. 2A illustrates a wafer 202 attached to a wafer chuck 204

(not to scale). Wafer 202 is attached via a clamping method, such as vacuum clamping or, in a preferred embodiment, electrostatic clamping.

Figure 2B:
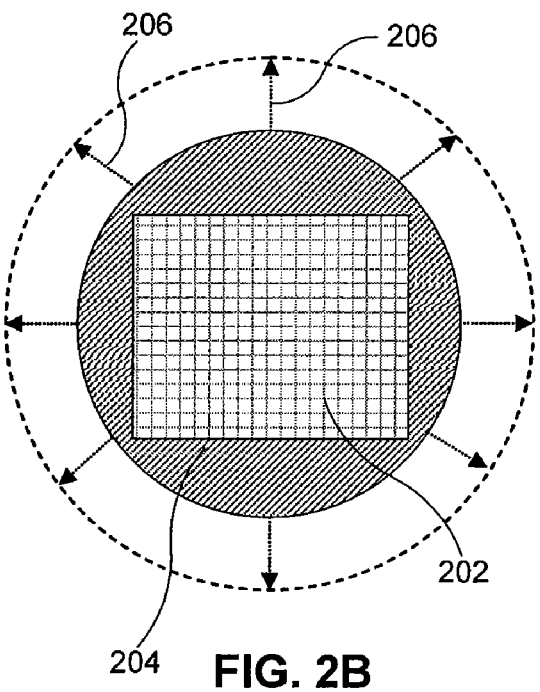
FIG. 2B is an illustration of a wafer chuck expanding in relation to a wafer.

FIG. 2B illustrates the expansion of wafer chuck 204, as occurs in step 104. Wafer chuck 204 expands uniformly in all directions, as indicated by arrows 206. During expansion, the size of wafer chuck 204 increases with respect to wafer 202.

Figure 2C:
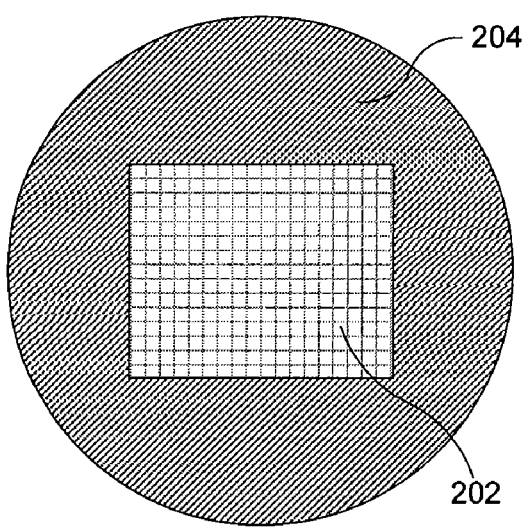
FIG. 2C is an illustration of a wafer attached to an expanded wafer chuck.

FIG. 2C illustrates a configuration of wafer 202 and wafer chuck 204 immediately before wafer 202 is exposed. Because of the wafer chuck expansion, there is an initial stress between wafer 202 and wafer chuck 204. Because wafer chuck 204 attempts to stretch wafer 202 as wafer chuck 204 expands, the initial stress on wafer 202 may be referred to as an outward force.

Figure 2D:
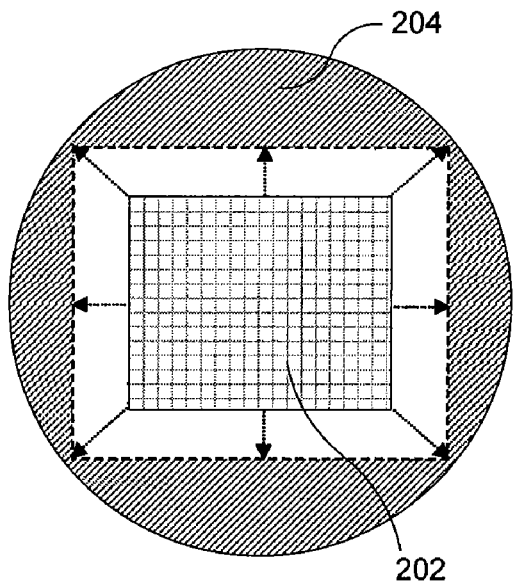
FIG. 2D is an illustration of a wafer expanding in relation to an expanded wafer chuck.

FIG. 2D illustrates the expansion of wafer 202 due to heating during exposure. As wafer 202 increases in size, the outward force is relieved. At some point during the wafer expansion, wafer 202 reaches a point where there is zero stress between wafer 202 and wafer chuck 204. If wafer 202 continues expanding past this point, an inward force is created on wafer 202. As long as the magnitude of this inward force does not exceed that of the frictional force between wafer 202 and wafer chuck 204, wafer 202 will not slip. Wafer chuck 204 also expands due to heating during exposure. The expansion of wafer chuck 204 lessens the expansion rate of wafer 202 relative to wafer chuck 204. Thus, the magnitude increase of the inward force created on wafer 202 is also lessened.

In a preferred embodiment, wafer 202 is a round wafer. In this embodiment, wafer 202 expands uniformly while heating. Since the expansion is uniform, there is no imbalance of the inward force on wafer 202, and the likelihood of slipping is lessened. Further, if the wafer expands uniformly, the exposure pattern can be magnified to compensate for the change in size. Compensation would be difficult if sections of the wafer expanded non-uniformly.

Figure 3A:
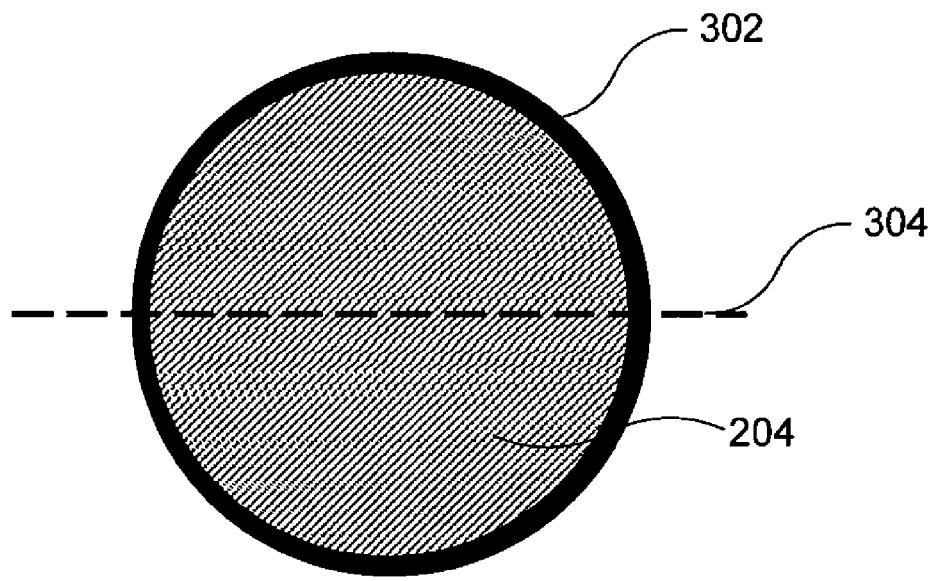
FIG. 3A is an illustration of an expansion system according to an embodiment of the present invention.
Figure 3B:
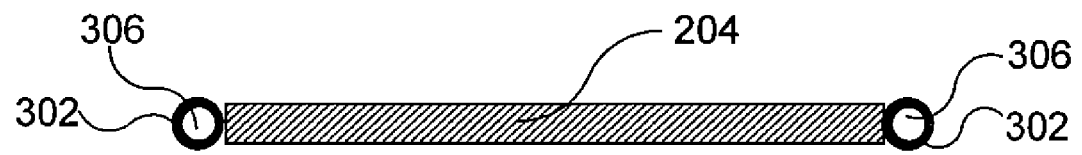
FIG. 3B is a cross-section illustration of the expansion system shown in FIG. 3A.

FIG. 3A is an illustration of an embodiment of a system of the present invention. An annular tube 302 is attached to the outside of wafer chuck 204. In one embodiment, annular tube 302 is a metal tube. In another embodiment, annular tube 302 is manufactured from a plastic. Annular tube 302 includes a cavity 306. Cavity 306 can be filled with either liquid or gas. When annular tube 302 is pressurized, it expands. Since annular tube 302 is attached to the edge of wafer chuck 204, wafer chuck 204 uniformly expands with it. FIG. 3B is a cross-section of the illustration in FIG. 3A, taken at line 304. As shown, annular tube 302 is attached to the edge of wafer chuck 204.

Figure 4A:
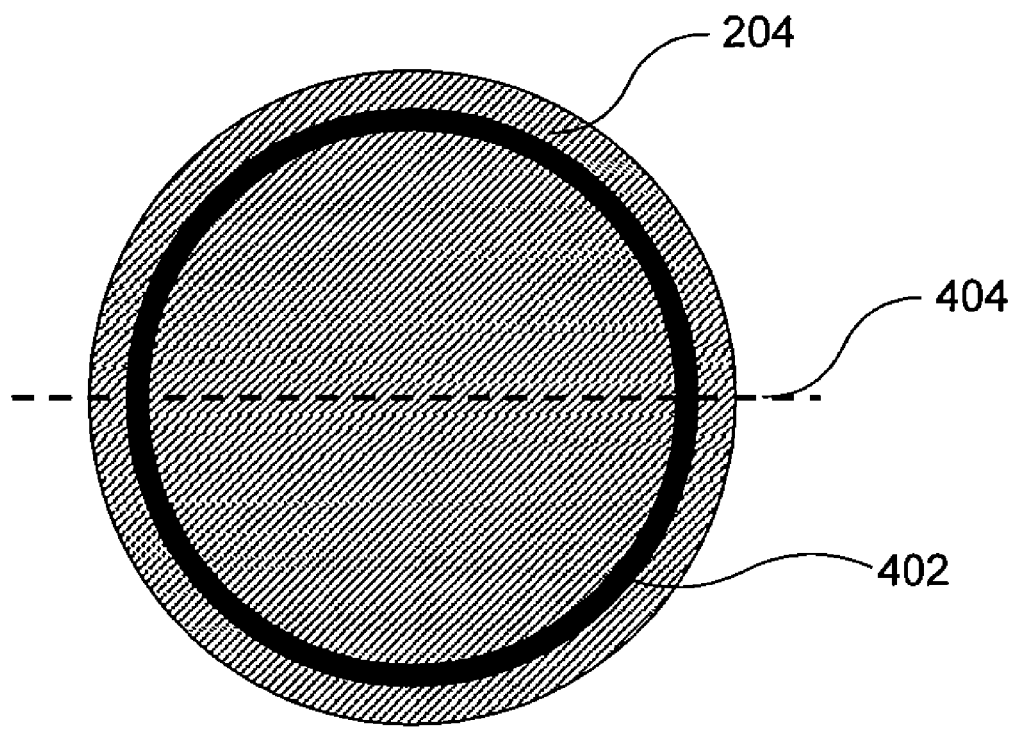
FIG. 4A is an illustration of another expansion system according to an embodiment of the present invention.
Figure 4B:
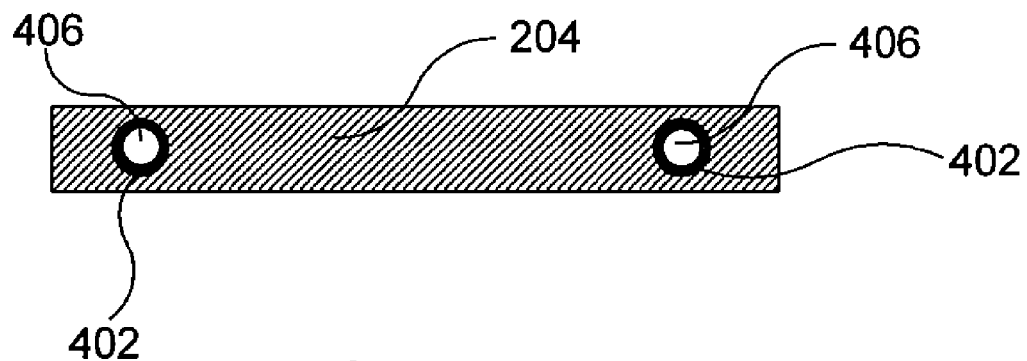
FIG. 4B is a cross-section illustration of the expansion system shown in FIG. 4A.

FIG. 4A is an illustration of another embodiment of the present invention. Similar to the above embodiment, an annular ring 402 having cavity 406 is attached to wafer chuck 204. In this embodiment, annular ring 402 is attached inside a cavity or groove in wafer chuck 204. Because annular ring 402 is embedded into wafer chuck 204, there is a lesser chance of annular ring 402 detaching from wafer chuck 204. In addition, non-uniformities caused by materials used to attach the annular ring to the edge of wafer chuck 204 are avoided. FIG. 4B is a cross-section of the illustration in FIG. 4A, taken at line 404. In one embodiment, annular ring 402 is fully enclosed in the structure of wafer 204, as shown in FIG. 4B. In another embodiment, annular ring 402 is only partially embedded in wafer chuck 204, as in a groove.

Figure 5:
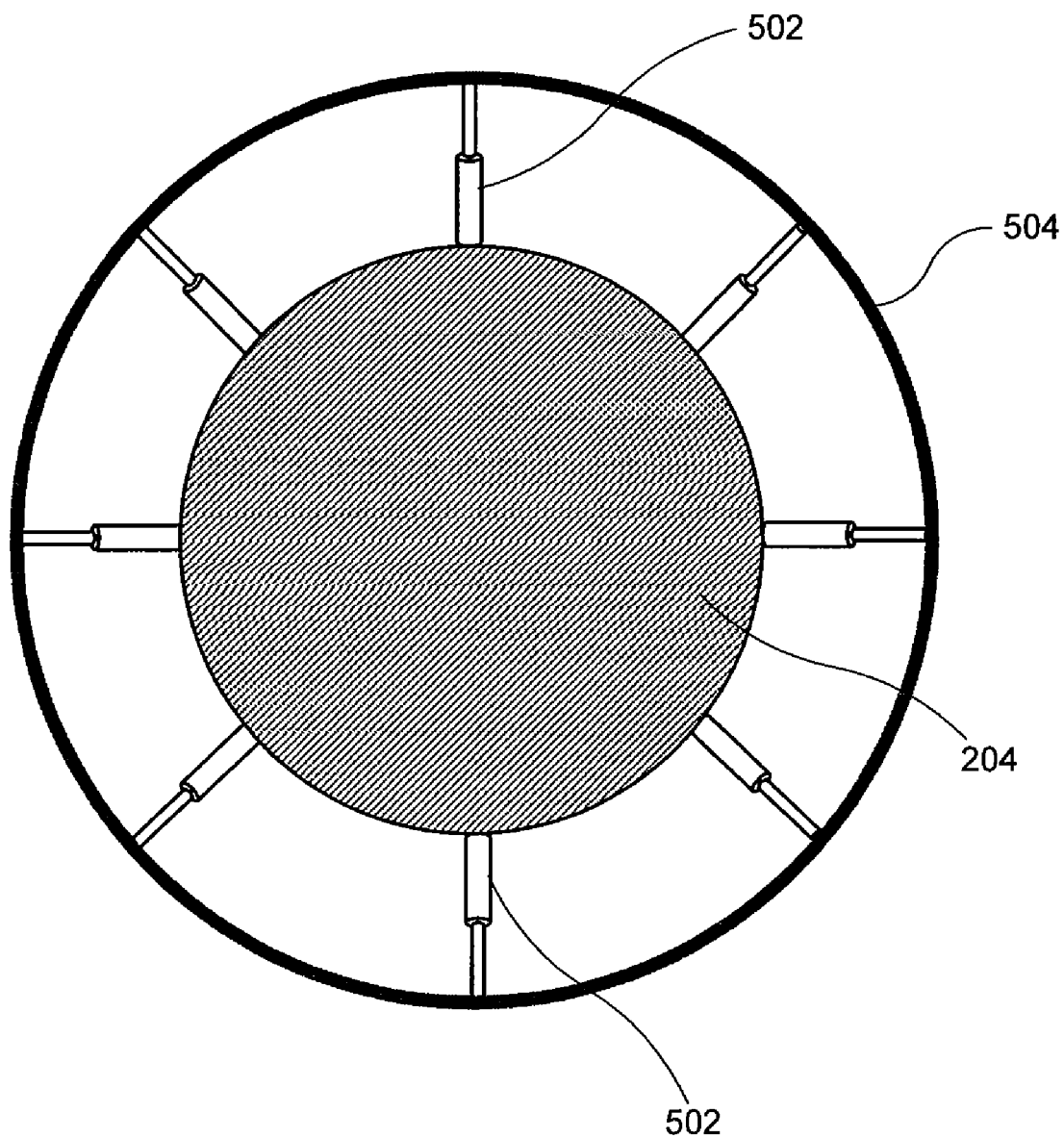
FIG. 5 is an illustration of another expansion system according to an embodiment of the present invention.

FIG. 5 is an illustration of another embodiment of the present invention. In this embodiment, a plurality of force actuators 502 are attached on one end to a fixed support 504, and on the other end to wafer chuck 204. The actual number of force actuators 502 used is variable. In one embodiment, force actuators 502 are distributed evenly and symmetrically around wafer chuck 204. When force actuators 502 are activated, they pull on wafer chuck 204. In this manner, force actuators 502 act together to exert a uniform force on wafer chuck 204 that is outward with respect to wafer chuck 204. This outward force causes uniform expansion of wafer chuck 204.

Figure 6A:
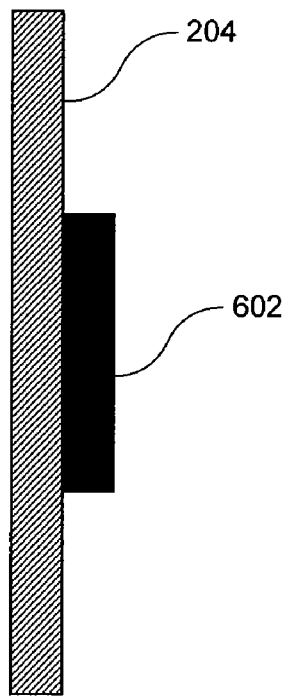
FIG. 6A is an illustration of an expansion system using a heater according to an embodiment of the present invention.

FIGS. 6A through 6D illustrate various embodiments of the present invention in which wafer chuck 204 is expanded through heating. In the embodiment of FIG. 6A, a contact heater 602 directly heats wafer chuck 204. As the temperature of wafer chuck 204 increases, wafer chuck 204 expands. Contact heater 602 may be as large as needed in comparison to wafer chuck 204 to cause uniform heating and expansion throughout wafer chuck 204. Although this embodiment provides direct heat flow, the attachment of heater 602 may inhibit the expansion of wafer chuck 204.

Figure 6B:
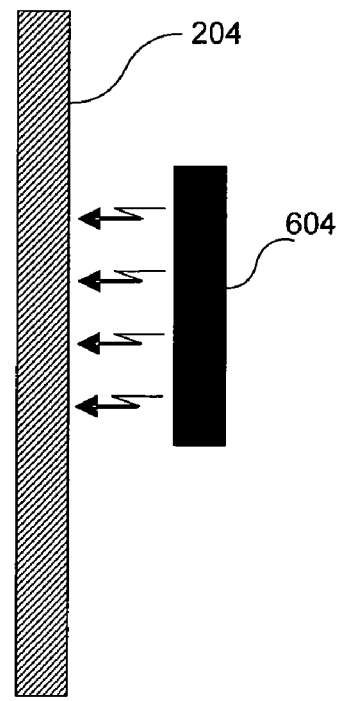
FIG. 6B is an illustration of another expansion system using a heater according to an embodiment of the present invention.
Figure 6C:
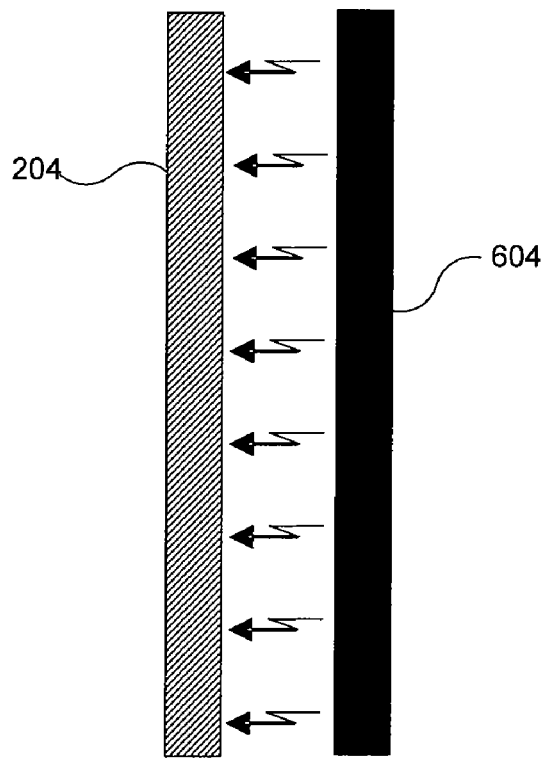
FIG. 6C is an illustration of another expansion system using a heater according to an embodiment of the present invention.

FIG. 6B illustrates another embodiment of the present invention. In this embodiment, a proximity heater 604 is placed near a surface of wafer chuck 204. Proximity heater 604 may heat via thermal or electromagnetic radiation. Since proximity heater 604 does not come in contact with wafer chuck 204, it does not inhibit expansion of wafer chuck 204. As shown in FIG. 6C, proximity heater 604 may vary in size and heat distribution as needed for uniform expansion of wafer chuck 204.

Figure 6D:
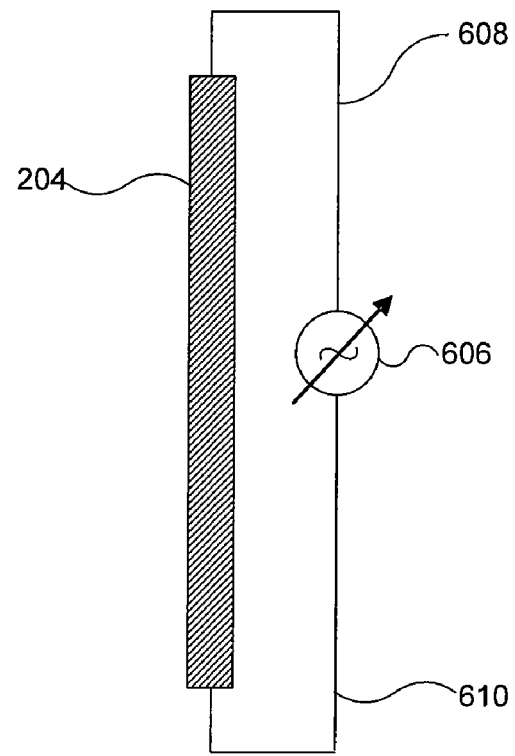
FIG. 6D is an illustration of another expansion system using a heater according to an embodiment of the present invention.

FIG. 6D illustrates another embodiment of the present invention in which a heater is used. In this embodiment, wafer chuck 204 is manufactured from an electrically conductive material. A power source 606 is connected to wafer chuck 204 by leads 608 and 610. As power passes through wafer chuck 204, it heats up and expands. Leads 608 and 610 may be flexible so as to allow the free expansion of wafer chuck 204. Power source 606 may be a variable power source.

In a further embodiment, wafer 202 is heated before being attached to wafer chuck 204, so that it is warmer than wafer chuck 204. In this embodiment, when wafer 202 is attached to wafer chuck 204, they reach thermal equilibrium. As wafer 202 cools, it contracts and thus creates an initial stress opposite that of an expansion force.

In each of the heating embodiments, a temperature sensor can be mounted on wafer stage 204 to monitor the expansion. A control circuit may be attached to the heater to precisely control or adjust the heating process.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of reducing wafer slipping in a lithography system having a wafer chuck, comprising:

attaching a wafer to the wafer chuck to create an interface between the wafer and the wafer chuck;

expanding the wafer chuck to create an initial stress on the interface;

aligning the wafer and chuck to a wafer stage; and exposing the wafer to a radiation source.

2. The method of claim 1, wherein said initial stress is sufficient to prevent slipping of the wafer during said exposing step.

3. The method of claim 2, wherein said expanding step comprises pressurizing an annular ring attached to the wafer chuck.

4. The method of claim 2, wherein said expanding step comprises actuating a force on the wafer chuck in a direction outward from the wafer chuck.

5. The method of claim 2, wherein said expanding step comprises heating the wafer chuck.

6. The method of claim 2, wherein said expanding step expands the wafer chuck uniformly in all directions.

7. A method of performing lithography in a vacuum, said method comprising:

attaching a wafer to a wafer chuck, to create an interface between the wafer and wafer chuck;

aligning the wafer to the wafer chuck;

expanding said wafer chuck to create an initial stress on the interface between the wafer and the wafer chuck; and exposing said wafer to a radiation source, wherein said initial stress on the interface between said wafer and said wafer chuck prevents slipping of said wafer during said exposing step.

8. The method of claim 7, wherein said expanding step comprises heating said wafer chuck.

9. The method of claim 7, wherein said expanding step comprises exerting a force on the edges of said wafer chuck, wherein said force is outward relative to said wafer chuck.

10. The method of claim 7, wherein said exposing step causes said wafer to expand.

11. A method of reducing overlay in a lithography system having a wafer chuck, comprising:

heating a wafer, to cause the wafer to expand in size;

attaching the heated wafer to the wafer chuck; and allowing the wafer to cool, thereby contracting in size and creating an initial stress between the wafer and the wafer chuck.

\* \* \* \* \*